United States Patent [19]

Obara et al.

[11] Patent Number: 4,743,784

[45] Date of Patent: May 10, 1988

[54] SENSE AMPLIFIER CIRCUIT

[75] Inventors: Takashi Obara; Shouji Kaneko, both of Tokyo, Japan

[73] Assignee: NEC Corporation, Tokyo, Japan

[21] Appl. No.: 883,215

[22] Filed: Jul. 8, 1986

[30] Foreign Application Priority Data

Jul. 8, 1985 [JP] Japan ................................ 60-150402

[51] Int. Cl.$^4$ ...................... G01R 19/00; H03K 3/26; G11C 7/00
[52] U.S. Cl. .................................. 307/530; 307/279; 365/203
[58] Field of Search ................ 365/203; 307/279, 482, 307/530, 518

[56] References Cited

U.S. PATENT DOCUMENTS

4,542,306 9/1985 Ikeda .................................... 307/482

Primary Examiner—John S. Heyman
Assistant Examiner—M. R. Wambach
Attorney, Agent, or Firm—Sughrue, Mion, Zinn, Macpeak and Seas

[57] ABSTRACT

For perfect states of balance on sense nodes, there is provided a sense amplifier circuit comprising a balancing circuit capable of establishing an electrical path between not only the sense nodes but also the sense nodes and control nodes which are operable to control transistors provided between the sense nodes and a voltage supply to apply the supply voltage level to one of the sense nodes and remain low level on the other sense node for preparation of reading out of an accessed information. The current path simultaneously established on the beginning of precharging prevents the sense nodes from influence of the large differential voltage on the control nodes, thereby producing the perfect balance states on all the nodes and being conducive to precise judgement on the read out information.

7 Claims, 4 Drawing Sheets

SENSE AMPLIFIER CIRCUIT

FIELD OF THE INVENTION

The present invention relates to a sense amplifier circuit, typically, that which is associated with a bit line of a memory device for quick judgement on binary data supplied from a selected memory cell to the bit line.

BACKGROUND OF THE INVENTION

On a semiconductor substrate are formed a plurality of sense amplifier circuits associated with respective bit lines each connected to a plurality of memory cells in which either binary data value is stored. When one of the memory cells commonly connected to a bit line is accessed during read mode, the voltage level of the bit line is varied to a certain voltage level depending upon the binary data stored therein, and the certain voltage level appearing on the bit line is then applied to the associated sense amplifier circuit together with a reference voltage level, typically, having an intermediate voltage level between the voltage levels of the two binary data for quick judgement of the binary data read out from the accessed memory cell.

Figure 1:
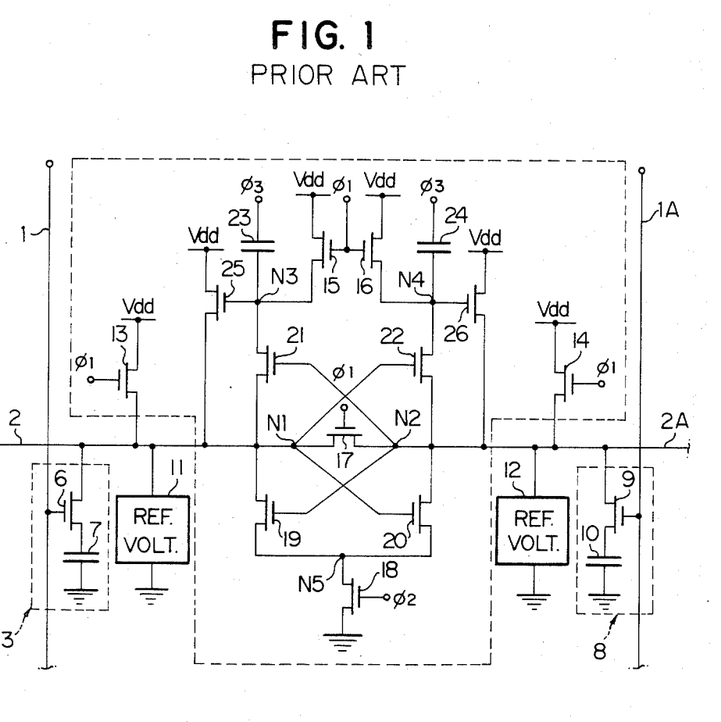
FIG. 1 is a circuit diagram showing an example of a known sense amplifier circuit.

A typical example of a known sense amplifier circuit incorporated in a dynamic random access memory device is illustrated in FIG. 1. The dynamic random access memory device is provided with a plurality of word lines and a plurality of bit lines arranged in rows and columns. However, only two of the word lines and two of the bit lines are shown in FIG. 1, and are indicated by reference numerals 1, 1A, 2 and 2A, respectively. To the bit line 2 are commonly connected a plurality of memory cells one of which is indicated by reference numeral 3 and comprises an n-channel MOS transistor 6 and a storage capacitor 7 capable of storing either binary data value in the form of a voltage level. The memory cell 3 is provided between the bit line 2 and the ground and gated by the decoded address signal appearing on the word line 1. To the bit line 2A are also connected a plurality of memory cells one of which is indicated by reference numeral 8 and similarly comprises an n-channel MOS transistor 9 and a storage capacitor 10. The bit lines 2 and 2A are paired and connected to respective sense nodes N1 and N2 of a sense amplifier circuit (indicated by a broken line). Whenever one of the memory cells connected to the bit line 2A is accessed, the bit line 2 is supplied from a reference voltage source 11 with a reference voltage of, typically, an intermediate voltage level between the voltage levels of the two binary data values. On the other hand, the bit line 2A is electrically connected to a reference voltage source 12 so that the reference voltage appears on the bit line 2A whenever the stored binary data is read out from the a selected memory cell to the bit line 2.

Figure 2:
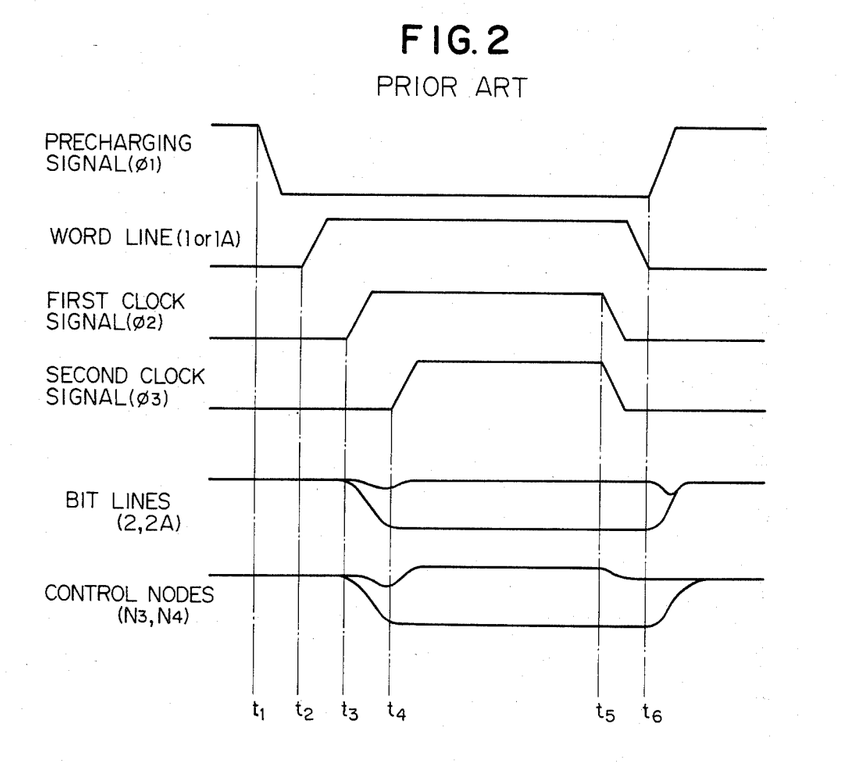
FIG. 2 is a timing chart showing waveforms of various signals appearing in the sense amplifier circuit illustrated in FIG. 1.

Turning to FIG. 2 which shows waveforms of signals in the sense amplifier circuit illustrated in FIG. 1, operations of the conventional sense amplifier circuit will be described on the assumption that the memory cell 3 storing the binary data of 1 is accessed. Prior to decoding a set of address signals applied to the address pins of the dynamic random access memory device, a precharging signal $\Phi 1$ remains high and is applied to n-channel MOS transistors 13, 14, 15, 16 and 17. The precharge transistors 13 and 14 are provided between the sense nodes N1 and N2 and a positive voltage source Vdd, respectively, and the precharge transistors 15 and 16 are, on the other hand, provided between control nodes N3 and N4 and the positive voltage source Vdd. The precharge transistors 13, 14, 15 and 16 thus connected are applied with the precharging signal $\Phi 1$, then the precharge transistors 13, 14, 15 and 16 turn on, supplying the sense nodes N1 and N2 and the control nodes N3 and N4 with a positive voltage of a certain level. When the sense node N1 and N2 are pulled up to the certain level, the voltages of the bit lines 2 and 2A also go up to the certain level and balance with each other through the transistor 17 which is concurrently turned on by the precharging signal $\Phi 1$.

After the precharging signal $\Phi 1$ goes down at time $t_1$, the address signals applied to the decoder circuit from the address pins are decoded, and the voltage of the word line 1 then rises for turning the MOS transistor 6 on at time $t_2$. When the MOS transistor 6 is turned on, the precharged bit line 2 is electrically connected to the storage capacity 7 through the MOS transistor 7. However, the storage capacitor 7 storing the binary data of 1 has been charged to a voltage level approximately equal to the certain level on the bit line 2, so that the substantial fluctuation does not take place on the bit line 2. When the word line 1 is selected, the digit line 2A is unconditionally connected to the reference voltage source 12 and then goes down to the intermediate voltage level. Thus, the paired bit lines 2 and 2A have different voltages and put a differential voltage of about 0.1 volt between the sense nodes N1 and N2 because different voltages are supplied from the paired bit lines 2 and 2A.

After the differential voltage appears on the sense nodes N1 and N2 based on the different voltages supplied from the paired bit lines 2 and 2A, a first clock signal $\Phi 2$ goes up at time $t_3$ and then an n-channel transistor 18 turns on by the action of the first clock signal $\Phi 2$. When the active transistor 18 is turned on, a current path is established between a common node N5 and the ground, thus pulling the common node down to the ground level. This causes a pair of cross coupled n-channel transistors 19 and 20 to simultaneously turn on with different channel conductances. Namely, the transistor 19 has a gate connected to the sense node N2 having the relatively low intermediate voltage level, then the channel is formed in the transistor 19 with a relatively small channel conductance. On the other hand, the transistor 20 has a gate connected to the sense node N1 having the relatively high voltage level, then the channel is produced in the transistor 20 with a relatively large channel conductance. The channels thus produced in the respective transistors 19 and 20 are different in channel conductance so that the voltage levels on the sense nodes N1 and N2 go down at different respective speeds, thus amplifying the differential voltage between the sense nodes N1 and N2. This results in a voltage level on the sense node N1 slightly lower than the certain voltage level and in a voltage level on the sense node N2 approximately equal to the ground level, as will be seen from the waveforms in FIG. 2.

The sense amplifier circuit illustrated in FIG. 1 further has a pair of cross coupled n-channel transistors 21 and 22 provided between the sense nodes N1 and N2 and the control nodes N3 and N4, respectively. The gates of the transistors 21 and 22 are cross coupled to the sense nodes N2 and N1. Therefore, the transistor 21 has a channel with a relatively small conductance but the transistor 22 has a channel with a relatively large conductance, thereby pulling the voltages of the control nodes N3 and N4 down to respective voltage levels corresponding to those on the sense nodes N1 and N2. This also results in a voltage level on the sense node N3 slightly lower than the certain voltage level and in a voltage level on the sense node N4 approximately equal to the ground level. The control nodes N3 and N4 are connected to pull-up capacitors 23 and 24, respectively. If a second clock signal $\Phi 3$ goes up to a preselected positive voltage level at time $t_4$, the control node N3 goes up over the positive voltage level Vdd to a certain high level which causes an n-channel transistor 25 to fully turn on, thereby supplying the sense node N1 with the positive voltage level Vdd. As the control node N4 has the voltage level approximately equal to the ground level, the control node N4 remains below the supply voltage level Vdd, thereby maintaining the transistor 26 in the off condition. The transistor 26 being thus in the off condition, the sense node N2 still remains in the voltage level approximately equal to the ground level as will be seen from the waveform thereof in FIG. 2. In this manner, the initial differential voltages of about 0.1 volt is amplified, and the binary data stored in the memory cell 3 is judged and read out based thereon.

The first and second clock signals $\Phi 2$ and $\Phi 3$ concurrently go down to the low levels at time $t_5$ so that the active transistor 18 turns off and the control node N3 goes down to the previous certain voltage level lower than the supply voltage level Vdd. This results in the transistor 25 being turned off. After the turning off of the transistor 25, the precharging signal $\Phi 1$ rises again to cause the MOS transistors 13, 14, 15, 16 and 17 to turn on at time $t_6$, so that the sense nodes N1 and N2 and the control nodes N3 and N4 are precharged to the certain level from the supply voltage level Vdd for preparation of subsequent read out cycle. The precharging signal $\Phi 1$ applied to the transistor 17 causes the transistor to turn on for balancing of the sense nodes N1 and N2.

The conventional sense amplifier circuit, however, has a drawback in that unbalance in voltage level tends to take place and, for this reason, the sense amplifier circuit sometimes obtains undesirable results which do not reflect the initial differential voltage. This results from the fact that the control nodes N3 and N4 have different voltage levels prior to their precharging, and are independently precharged through the respective transistors 15 and 16 supplied with the precharging signal $\Phi 2$. The control nodes N3 and N4 thus having the different voltage levels are then saturated to the certain voltage level at different times and need a long period of time to balance with each other as will be understood from the waveforms in FIG. 2. As a result of the independent precharging, the unbalance in voltage is liable to take place on the control nodes N3 and N4. In addition, the precharging signal $\Phi 1$ typically has a voltage level approximately equal to the supply voltage level Vdd, so that the period of time needed tends to be prolonged. During the above described long period of time, if a fluctuation of the supply voltage level Vdd takes place, the fluctuation may promote the unbalance on the control nodes N3 and N4. The sense nodes N1 and N2 are supplied with a small differential voltage of, for example, 0.1 volt so that any inbalance between the control nodes N3 and N4 has significant influence on the small differential voltage, and inverts the relation of the magnitude of the voltage levels on the sense nodes N1 and N2 in some cases.

The present invention contemplates elimination of these drawbacks which have thus far been inherent in the conventional sense amplifier circuit.

SUMMARY OF THE INVENTION

In accordance with the present invention, there is provided a sense amplifier circuit for amplifying a differential voltage between first and second sense nodes applied with different voltages, comprising (1) a first cross coupled circuit including first and second field effect transistors provided between the first and second sense nodes and a first constant voltage source of a certain voltage level, respectively, and having gates respectively cross coupled to the second and first sense nodes for varying the different voltages on the first and second sense nodes toward the certain voltage level at the different speeds so as to amplify the differential voltage, (2) a second cross coupled circuit including third and fourth field effect transistors provided between the first and second sense nodes and first and second control nodes, respectively, and having gates rspectively cross coupled to the second and first sense nodes for putting different voltages on the first and second control nodes, respectively, in accordance with the different voltages on the first and second sense nodes, (3) a pulling circuit capacitively coupled to the first and second control nodes and activated by an activation of a first signal of a preselected voltage level for varying the voltage of one of the first and second control nodes across the preselected voltage level, the other of the first and second control nodes having a voltage level closer to the certain voltage level than aforesaid one of the first and second nodes prior to the activation of the first signal, (4) a load circuit including fifth and sixth field effect transistors provided between the first and second sense nodes and a second voltage source of the preselected voltage level, respectively, and having gates respectively connected to the first and second control nodes for supplying the first or second sense node with the preselected voltage level through the fifth or sixth field effect transistor connected to aforesaid one of the first and second control nodes, and (5) a balancing circuit including seventh, eight and ninth field effect transistors, the seventh and eighth field effect transistors being provided between the first and second sense nodes and the second and first control nodes, respectively, the ninth field effect transistor being provided between the first and second sense nodes, the seventh, eighth and ninth field effect transistors having gates turned on by an activation of a second clock signal posterior to a recovery of the first clock signal for balancing the voltages of the first and second control nodes with each other.

BRIEF DESCRIPTION OF THE DRAWINGS

The features and advantages of a sense amplifier circuit according to the present invention will be more clearly understood from the following description taken in conjunction with the accompanying drawings in which like reference numerals designate similar or corresponding elements and portions and in which.

DESCRIPTION OF THE PREFERRED EMBODIMENT

Figure 3:
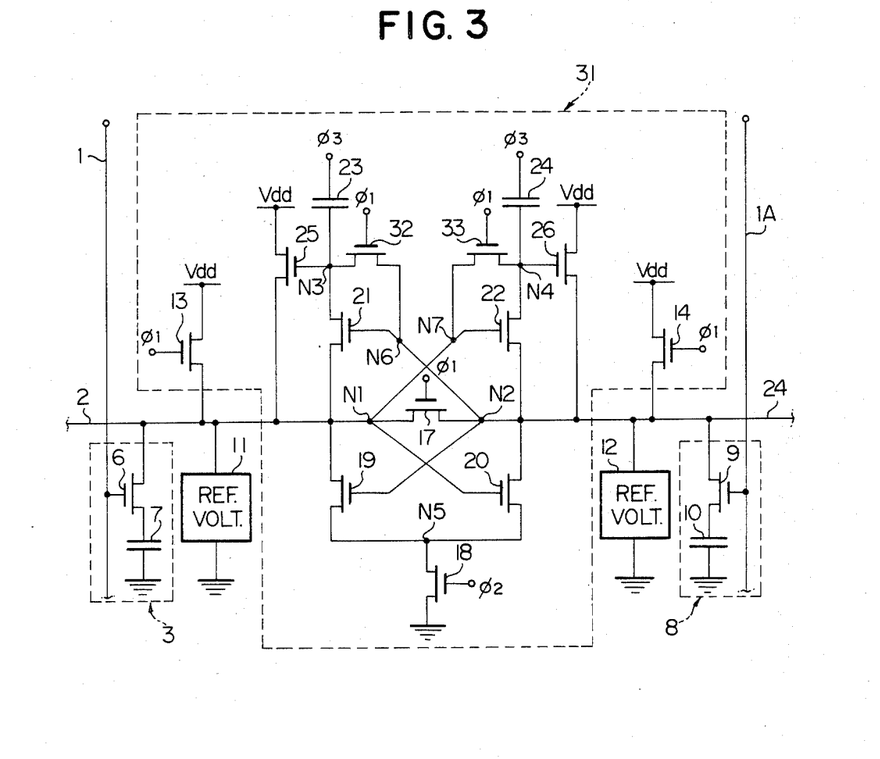
FIG. 3 is a circuit diagram showing a preferred embodiment of a sense amplifier circuit according to the present invention.

Referring to FIG. 3 of the drawings, a preferred embodiment of a sense amplifier circuit 31 according to the present invention largely comprises a first cross coupled circuit provided with the transistors 19 and 20, a second cross coupled circuit provide with the transistors 21 and 22, a pulling circuit provided with the capacitors 23 and 24, a load circuit provided with the transistors 13 and 14, a precharging circuit provided with the transistor 17 but also n-channel transistors 32 and 33. The transistors 32 and 33 are provided between the control nodes N3 and N4 and intermediate nodes N6 and N7, respectively, which are arranged to be disposed on the electrical paths between the sense nodes N1 and N2 and the gates of the transistors 21 and 22 forming parts of the aforesaid second cross coupled circuit. The balancing circuit thus provided with the transistors 17, 32 and 33 is capable of establishing an electrical path between the control nodes N3 and N4 when the precharging signal Φ1 goes to active high.

Operations of the sense amplifier circuit illustrated in FIG. 3 will be described hereinunder with reference to FIG. 4 which shows the waveforms of the signals appearing in the circuit.

Assuming now that an external device such as a microprocessor (not shown) supplies a random access memory device employing the sense amplifier circuits according to the present invention with a set of address signals which represent the address of the memory cell 3 storing binary data of "1", the random access memory device transfers the address signals from a set of address pins to a decoder circuit (not shown) for decoding the address signals. As shown by the waveform of the precharging signal Φ1, the precharging signal Φ1 remains in active high prior to the selection of the memory cell 3. The precharging signal Φ1 thus remaining at the high level is concurrently applied to the respective gates of the transistors 13, 14, 17, 32 and 33, and causes these transistors 13, 14, 17, 32 and 33 to turn on, thereby precharging the sense nodes N1 and N2 and the control nodes N3 and N4 to the certain level and balancing the voltage levels on not only the sense nodes N1 and N2 but also the control nodes N3 and N4 with each another. After reaching the certain voltage level, the precharging signal Φ1 goes down to turn the transistors 13, 14, 17, 32 and 33 off at time $t_1$. The decoding of the address signals follows, and the voltage of the word line 1 then rises for turning the transistor 6 on at time $t_2$. When the MOS transistor 6 is turned on, the precharged bit line 2 is electrically connected to the storage capacitor 7 through the MOS transistor 7. However, the storage capacitor 7 storing the binary data of "1" has been charged to a voltage level approximately equal to the certain level on the bit line 2, so that no substantial fluctuation takes place on the bit line 2. When the word line 1 is selected, the bit line 2A is unconditionally connected to the reference voltage source 12 and then goes down to the intermediate voltage level. Thus, paired bit lines 2 and 2A have different voltages and put a differential voltage of about 0.1 volt between the sense nodes N1 and N2 to which the different voltages are supplied from the paired bit lines 2 and 2A.

After the differential voltage appears on the sense nodes N1 and N2 based on the different voltages supplied from the paired bit lines 2 and 2A, the first clock signal Φ2 goes up at time $t_3$ and then the active transistor 18 turns on by the action of the first clock signal Φ2. When the active transistor 18 is turned on, a current path is established between the common node N5 and ground, thus pulling the common node down to the ground level. This causes the pair of cross coupled n-channel transistors 19 and 20 to simultaneously turn on with different channel conductances. Namely, the transistor 19 has the gate connected to the sense node N2 having the relatively low intermediate voltage level, so that a channel is produced in the transistor 19 with a relatively small channel conductance. On the other hand, the transistor 20 has the gate connected to the sense node N1 having the relatively high voltage level so that the channel is produced in the transistor 20 with a relatively large channel conductance. The channel thus produced in the respective transistors 19 and 20 are different in conductance so that the voltage levels on the sense nodes N1 and N2 go down at different speeds, thus amplifying the differential voltage on the sense nodes N1 and N2. This results in a voltage level on the sense node N1 slightly lower than the certain voltage level and a voltage level on the sense node N2 approximately equal to the ground level as will be seen from the waveforms in FIG. 4.

Figure 4:
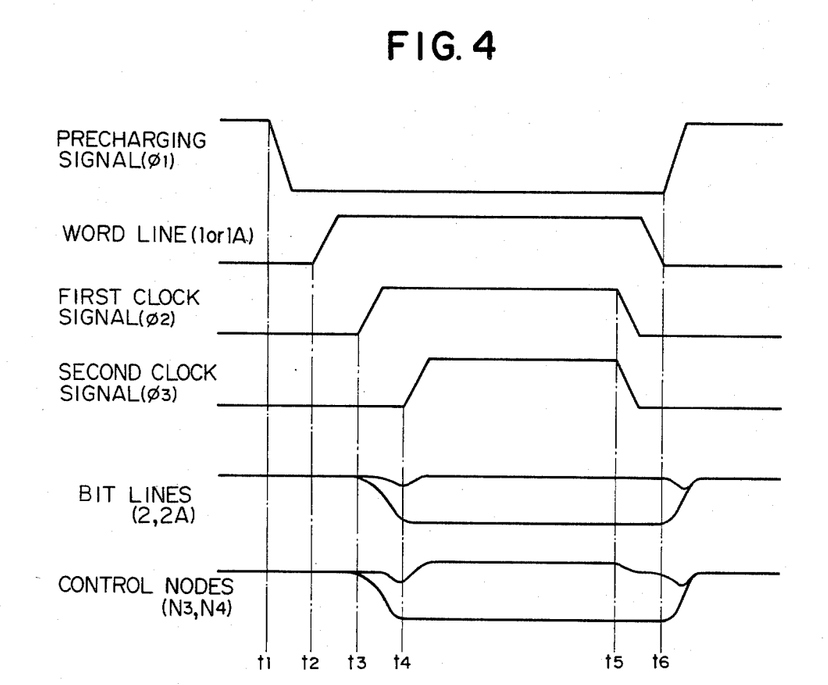
FIG. 4 is a timing chart showing waveforms of various signals appearing in the sense amplifier circuit illustrated in FIG. 3.

In a similar manner, transistors 21 and 22 forming parts of the second cross coupled circuit have respective channels with different conductances which cause the precharged control nodes N3 and N4 to go down at different speeds, then appearing on the control nodes N3 and N4 voltage levels corresponding to those on the sense nodes N1 and N2, respectively as will be seen from the waveforms in FIG. 4.

A pull-up operation follows. If the second clock signal Φ3 goes up to the preselected positive voltage level at time $t_4$, the control node N3 goes up over the positive voltage level Vdd to a certain high level which causes the n-channel transistor 25 to fully turn on, thereby supplying the sense node N1 with the positive voltage level Vdd. As the control node N4 has a voltage level approximately equal to the ground level, the transistor 26 remains in off condition. The transistor 26 thus maintained in off condition causes the sense node N4 to stay in the voltage level approximately equal to the ground level as will be seen from its waveform in FIG. 4. In this manner, the initial differential voltage of about 0.1 volt is amplified for judgement of the binary data and reading out.

After the reading out of the binary data stored in the memory cell 3, the first and second clock signal Φ2 and Φ3 concurrently go down to the inactive low level at time $t_5$, thus causing the transistors 18 to turn off. When the transistor 18 is turned off, the common node N5 is isolated from the ground and put into the high impedance state. The capacitor 23, on the other hand, pulls the control node N3 down to the previous voltage level with the second clock signal Φ3, so that a differential voltage arises between the control nodes N3 and N4 as in the conventional sense amplifier circuit described hereinbefore.

In order to precharge the sense nodes N1 and N2 and the control nodes N3 and N4, the precharging signal Φ1 goes up at time $t_6$. When the precharging signal Φ1 goes into the active high level, the transistors 13, 14, 17, 32 and 33 are turned on, electric paths are established from the voltage supply source Vdd to the control nodes N4 and N3 through the transistors 13 and 14, sense nodes N1 and N2, intermediate nodes N7 and N6 and further transistors 33 and 32, respectively. These current paths are electrically connected to each other through the transistor 17 in the on condition. This causes the control nodes N3 and N4 as well as the sense nodes N1 and N2 to be in states of perfect balance regardless of the voltage level of the precharging signal Φ1 and the fluctuation of the voltage source level Vdd as will be seen from the waveforms in FIG. 4. The sense nodes N1 and N2 and the control nodes N3 and N4 thus precisely balanced with each other at the early stage in the precharging cycle are conducive to elimination of the possible misreading inherent in the conventional sense amplifier circuit.

In addition, the sense amplifier circuit illustrated in FIG. 4 is formed with a plurality of n-channel MOS transistors, but it is possible to form a sense amplifier circuit according to the present invention with a plurality of p-channel MOS transistors.

As will be understood from the foregoing description, the sense amplifier circuit according to the present invention has the balancing circuit capable of establishments of the electric path between the control nodes so that the control nodes are dependently precharged to the certain voltage level and, for this reason, balance with each other at early stage in the precharging cycle. Moreover, the sense amplifier circuit according to the present invention needs no additional transistors to form the electric path between the control nodes, thus making it possible to implement the sense amplifier circuit on a semiconductor substrate without reduction of memory cell density.

What is claimed is:

1. A sense amplifier circuit for amplifying a differential voltage between first and second sense nodes applied with different voltages, comprising:

a first cross coupled circuit including first and second field effect transistors having source-drain paths coupled between the first and second sense nodes and a common node, respectively, and having gates respectively coupled to the second and first sense nodes, and discharge means coupled between said common node and a reference voltage terminal for operatively discharging charges at said common node in response to a sense control signal;

a second cross coupled circuit including third and fourth field effect transistors having source-drain paths coupled between the first and second sense nodes and first and second control nodes, respectively, and having gates coupled to the second and first sense nodes, respectively;

a pulling circuit including first and second capacitors coupled between said first and second control nodes and a drive node, respectively, said drive node receiving a pull up control signal;

a load circuit including fifth and sixth field effect transistors having source-drain paths between the first and second sense nodes and a second voltage source, respectively, and having gates connected to the first and second control nodes, respectively; and a balancing circuit including seventh, eighth and ninth field effect transistors, the seventh and eighth field effect transistors having source-drain paths coupled between the first and second sense nodes and the second and first control nodes, respectively, the ninth field effect transistor having a source-drain path coupled between the first and second sense nodes, the seventh, eighth and ninth field effect transistors being rendered conductive in response to a precharge control signal applied to control inputs thereof.

2. A sense amplifier circuit as set forth in claim 1, in which the sense amplifier circuit further comprises a precharging circuit coupled between the first and second sense nodes and a predetermined voltage source precharging the first and second sense nodes in response to said precharge control signal.

3. A sense amplifier circuit as set forth claim 1, in which the first and second sense nodes are supplied with different voltages from a selected memory cell forming part of a memory cell array and a reference voltage source, respectively.

4. A sense amplifier comprising a cross-coupled circuit coupled to first and second sense nodes for operatively discharging one of said first and second sense nodes, a first field effect transistor having a source-drain path coupled between said first sense node and a first control node and having a gate coupled to said second sense node, a second field effect transistor having a source-drain path coupled between said sense node and a second control node and having a gate coupled to said first sense node, a first capacitor having a first terminal coupled to said first control node, a second capacitor having a first terminal coupled to said second control node, a first transistor switch circuit having a principal current path between said first control node and the gate of said first transistor for operatively shortcircuiting therebetween in response to a control signal applied to a control input thereof, a second transistor switch circuit having a principal current path between said second control node and the gate of said second transistor for operatively shortcircuiting therebetween in response to said control signal applied to a control input thereof, a first charge supply circuit responsive to the potential of said first control node for supplying said first sense node with electric charges, a second charge supply circuit responsive to the potential of said second control node for supplying said second sense node with electric charges and control means for operatively supplying second terminals of said first and second capacitors with electric charges.

5. A sense amplifier, comprising:

a cross-coupled circuit coupled to first and second sense nodes for operatively discharging one of said first and second sense nodes;

a first field effect transistor having a source-drain path coupled between said first sense node and a first control node and having a gate coupled to said second sense node;

a second field effect transistor having a source-drain path coupled between said second sense node and a second control node and having a gate coupled to said first sense node;

a first capacitor having a first terminal coupled to said first control node;

a second capacitor having a first terminal coupled to said second control node;

a first transistor switch circuit having a principal current path between said first control node and the gate of said first transistor for operatively shortcircuiting therebetween in response to a control signal applied to a control input thereof;

a second transistor switch circuit having a principal current path between said second control node and the gate of said second transistor for operatively shortcircuiting therebetween in response to said control signal applied to a control input thereof;

a first charge supply circuit responsive to the potential of said first control node for supplying said first sense node with electric charge;

a second charge supply circuit responsive to the potential of said second control node for supplying said second sense node with electric charge; and control means for operatively supplying second terminals of said first and second capacitors with electric charge, wherein said first and second transistor switch circuits are turned on for balancing said first and second sense nodes and said first and second control nodes, said first and second field effect transistors are turned on to assist the first and second switch circuits in the balancing operation, said cross-coupled circuit is activated for producing a difference in voltage between said first and second sense nodes after the balancing operation, said first and second field effect transistors are operative to propagate said difference in voltage level to said first and second control nodes, said first or second capacitor is operative to pull up said first or second control node for amplification of said difference in voltage therebetween, and said first or second charge supply circuit is activated to assist said cross-coupled circuit in the amplification of said difference in voltage between said first and second sense nodes.

6. A sense amplifier circuit for amplifying a differential voltage between first and second sense nodes applied with different voltages, comprising:

a first cross coupled circuit including first and second field effect transistors having source-drain paths coupled between the first and second sense nodes and a common node, respectively, and having gates respectively coupled to the second and first sense nodes, and discharge means coupled between said common node and a reference voltage terminal for operatively discharging charges at said common node in response to a sense control signal;

a second cross coupled circuit including third and fourth field effect transistors having source-drain paths coupled between the first and second sense nodes and first and second control nodes, respectively, and having gates coupled to the second and first sense nodes, respectively;

a pulling circuit including first and second capacitors coupled between said first and second control nodes and a drive node, respectively, said drive node receiving a pull up control signal;

a load circuit including fifth and sixth field effect transistors having source-drain paths between the first and second sense nodes and a power voltage source, respectively, and having gates connected to the first and second control nodes respectively;

a balancing circuit including seventh, eighth and ninth field effect transistors, the seventh and eighth field effect transistors having source-drain paths coupled between the first and second sense nodes and the second and first control nodes, respectively, the ninth field effect transistor having a source-drain path coupled between the first and second sense nodes; and control means for rendering the seventh, eighth and ninth field effect transistors to be conductive in response to a precharge control signal applied to control inputs thereof, wherein said precharge control signal is activated after inactivation of said sense control signal and said pull up control signal, said sense control signal is activated after inactivation of said precharging control signal, and said pull up control signal is activated after activation of said sense control signal.

7. A sense amplifier circuit for amplifying a differential voltage between first and second sense nodes applied with different voltages, comprising:

a first cross coupled circuit including first and second n-channel type field effect transistors having source-drain paths coupled between the first and second sense notes and a common node, respectively, and having gates respectively coupled to the second and first sense nodes, and an n-channel type discharge field effect transistor coupled between said common node and a ground voltage terminal for operatively discharging charges at said common node in response to a sense control signal;

a second cross coupled circuit including third and fourth n-channel type field effect transistors having source-drain paths coupled between the first and second sense nodes and first and second control nodes, respectively, and having gates coupled to the second and first sense nodes, respectively;

a pulling circuit including first and second capacitors coupled between said first and second control nodes and a drive node, respectively, said drive node receiving a pull up control signal;

a load circuit including fifth and sixth n-channel type field effect transistors having source-drain paths between the first and second sense nodes and a positive power voltage source, respectively, and having gates connected to the first and second control nodes respectively;

a balancing circuit including seventh, eighth and ninth n-channel type field effect transistors, the seventh and eighth field effect transistors having source-drain paths coupled between the first and second sense nodes and the second and first control nodes, respectively, the ninth field effect transistor having a source-drain path coupled between the first and second sense nodes, the seventh, eighth and ninth field effect transistors turning on in response to a precharge control signal; and control means for making said precharge control signal go to a positive high level after recovery of said sense control signal and said pull up control signal, for making said sense control signal go to a positive high level after recovery of said precharging control signal, and for making said pull up control signal go to a positive high level after said sense control signal has gone to the positive high level.

* * * * *

UNITED STATES PATENT AND TRADEMARK OFFICE
CERTIFICATE OF CORRECTION

PATENT NO. : 4,743,784

DATED : May 10, 1988

INVENTOR(S) : Obara et al

It is certified that error appears in the above-identified patent and that said Letters Patent is hereby corrected as shown below:

COLUMN 1, LINE 23   After "read" delete --,--;

COLUMN 1, LINE 61   Delete "1" insert --"1"--;

COLUMN 2, LINE 19   Delete "capacity" insert --capacitor--; delete "7" (second occurrence) and insert --6--;

COLUMN 2, LINE 24   Delete "digit" and insert --bit--;

COLUMN 5, LINE 18   After "with the" insert --transistors 13 and 14, and a balancing circuit provided with not only the--;

COLUMN 7, LINE 35   Delete "momory" insert --memory--;

Signed and Sealed this

Eighteenth Day of October, 1988

Attest:

DONALD J. QUIGG

*Attesting Officer*   Commissioner of Patents and Trademarks